United States Patent
Kasai et al.

(10) Patent No.: US 9,224,623 B2
(45) Date of Patent: Dec. 29, 2015

(54) MICROWAVE IRRADIATION APPARATUS

(75) Inventors: Shigeru Kasai, Nirasaki (JP); Ryoji Yamazaki, Nirasaki (JP); Mitsutoshi Ashida, Nirasaki (JP); Yuji Obata, Nirasaki (JP); Sumi Tanaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 890 days.

(21) Appl. No.: 13/399,163

(22) Filed: Feb. 17, 2012

(65) Prior Publication Data

US 2012/0211486 A1   Aug. 23, 2012

(30) Foreign Application Priority Data

Feb. 23, 2011 (JP) ................................. 2011-037396
Sep. 2, 2011 (JP) ................................. 2011-192069

(51) Int. Cl.
| H05B 6/66 | (2006.01) |
| H05B 6/72 | (2006.01) |
| C23F 1/00 | (2006.01) |
| C23C 16/00 | (2006.01) |
| H01L 21/67 | (2006.01) |
| H05B 6/80 | (2006.01) |

(52) U.S. Cl.
CPC .... *H01L 21/67017* (2013.01); *H01L 21/67109* (2013.01); *H01L 21/67115* (2013.01); *H01L 21/67248* (2013.01); *H05B 6/806* (2013.01)

(58) Field of Classification Search
CPC ................ C23C 16/4586; C23C 16/46; H01L 21/67103; H01J 2237/2001
USPC ......... 219/679, 682, 685, 686, 691, 711, 712, 219/716, 746, 749, 750, 751; 118/724, 725, 118/728, 723 MW; 156/345.51, 345.52, 156/345.53; 438/777, 778
See application file for complete search history.

(56) References Cited

U.S. PATENT DOCUMENTS

| 4,430,539 | A * | 2/1984 | Suzuki ........................ 219/749 |
| 6,432,208 | B1 * | 8/2002 | Kawakami et al. ........... 118/728 |
| 7,436,645 | B2 | 10/2008 | Holland et al. |
| 7,589,028 | B1 * | 9/2009 | Cho et al. ...................... 438/778 |
| 2007/0137575 | A1 * | 6/2007 | Ohmi et al. .......... 118/723 MW |
| 2009/0104351 | A1 | 4/2009 | Kakegawa |
| 2010/0236579 | A1 | 9/2010 | Araki |
| 2010/0323529 | A1 * | 12/2010 | Honda et al. .................. 438/777 |

FOREIGN PATENT DOCUMENTS

| CN | 1945807 A | 4/2007 |
| CN | 101361169 A | 2/2009 |

(Continued)

*Primary Examiner* — Quang Van
(74) *Attorney, Agent, or Firm* — Pearne & Gordon LLP

(57) ABSTRACT

There is provided a microwave irradiation apparatus capable of independently controlling a temperature of a target object while irradiating microwave to the target object. The microwave irradiation apparatus 2 includes a processing chamber 4 configured to be vacuum-evacuated; a supporting table 6 configured to support the target object; a processing gas introduction unit 106 configured to introduce a processing gas into the processing chamber; a microwave introduction unit 72 configured to introduce the microwave into the processing chamber; a heating unit 16 configured to heat the target object; a gas cooling unit 104 configured to cool the target object by a cooling gas; a radiation thermometer 64 configured to measure a temperature of the target object; and a temperature control unit 70 configured to adjust the temperature of the target object by controlling the heating unit and the gas cooling unit based on the temperature measured by the radiation thermometer.

8 Claims, 7 Drawing Sheets

<SECOND ILLUSTRATIVE EMBODIMENT>

(56) References Cited

FOREIGN PATENT DOCUMENTS

| | | |
|---|---|---|
| CN | 101365823 A | 2/2009 |
| CN | 101416276 A | 4/2009 |
| JP | 4053173 B2 | 2/2008 |
| JP | 2009-516375 A | 4/2009 |
| JP | 2010-129790 A | 6/2010 |
| KR | 10-2006-0017768 A | 2/2006 |
| KR | 10-2009-0125127 A | 12/2009 |
| WO | 2007/059027 A2 | 5/2007 |

* cited by examiner

MICROWAVE IRRADIATION APPARATUS

CROSS-REFERENCE TO RELATED APPLICATION

This application claims the benefit of Japanese Patent Application Nos. 2011-037396 and 2011-192069 filed on Feb. 23, 2011 and Sep. 2, 2011, respectively, the entire disclosures of which are incorporated herein by reference.

FIELD OF THE INVENTION

The present disclosure relates to a microwave irradiation apparatus that performs a quality modification (reforming) process or an annealing process by irradiating microwave to a target object such as a semiconductor wafer.

BACKGROUND OF THE INVENTION

Generally, in order to manufacture a semiconductor device, various heat treatments such as a film forming process, a pattern etching process, an oxidation diffusion process, a quality modification (reforming) process, and an annealing process are repeatedly performed onto a semiconductor wafer. As semiconductor devices have been developed to have high density, multi-layers, and high integration, requirements thereof have become stricter every year. Further, it is demanded to improve uniformity in the surface of the wafer, to improve a film property and to shorten a required time when performing these various heat treatments.

By way of example, the annealing process or the quality modification (reforming) process has been generally performed onto a surface of the semiconductor wafer by a processing apparatus including a heating lamp or a heater. In the processing apparatus, the semiconductor wafer is heated in an atmosphere of a processing gas such as an inert gas, and the annealing process or the quality modification (reforming) process is performed onto the surface of the semiconductor wafer.

In recent years, when the quality modification (reforming) process or the annealing process for activating dopants is performed, there has been suggested a microwave irradiation apparatus using microwave (see Patent Documents 1 and 2). This is because a thin active layer can be formed while suppressing diffusion of impurities and lattice defects can be recovered.

Patent Document 1: Published Japanese Translation of PCT Patent Application No. 2009-516375
Patent Document 2: Japanese Patent Laid-open Publication No. 2010-129790

As described above, by using the microwave, it is possible to efficiently perform various processes in a short time. When various processes are performed by the above-described microwave irradiation apparatus, it is very important to control a temperature of a semiconductor wafer as a target object. However, a conventional microwave irradiation apparatus cannot sufficiently control the temperature of the wafer. Further, the temperature of the wafer may be controlled by controlling an input power of the microwave. However, in some processes, the power of the microwave and the temperature of the wafer need to be controlled independently from each other, but the conventional microwave irradiation apparatus cannot meet these needs. For this reason, this problem needs to be solved as soon as possible. Further, in other processes, the wafer heated by the microwave needs to be efficiently cooled while the microwave is efficiently irradiated to the wafer.

BRIEF SUMMARY OF THE INVENTION

Illustrative embodiments are conceived to solve the above-described problems. In an illustrative embodiment, there is provided a microwave irradiation apparatus capable of independently controlling a temperature of a target object while irradiating microwave to the target object. Further, in another illustrative embodiment, there is provided a microwave irradiation apparatus capable of efficiently cooling a target object while irradiating microwave to the target object.

In accordance with one aspect of an illustrative embodiment, there is provided a microwave irradiation apparatus that processes a target object by irradiating microwave. The microwave irradiation apparatus includes a processing chamber configured to be vacuum-evacuated; a supporting table configured to support the target object; a processing gas introduction unit configured to introduce a processing gas into the processing chamber; a microwave introduction unit configured to introduce the microwave into the processing chamber; a heating unit configured to heat the target object; a gas cooling unit configured to cool the target object by a cooling gas; a radiation thermometer configured to measure a temperature of the target object; and a temperature control unit configured to adjust the temperature of the target object by controlling the heating unit and the gas cooling unit based on the temperature measured by the radiation thermometer.

With this configuration, while the microwave is irradiated to the target object, the temperature of the target object is measured by the radiation thermometer. Based on the measured temperature, the heating unit and the gas cooling unit can be controlled so that the temperature of the target object can be controlled.

In accordance with another aspect of an illustrative embodiment, there is provided a microwave irradiation apparatus that processes a target object by irradiating microwave. The microwave irradiation apparatus includes a processing chamber configured to be vacuum-evacuated; a supporting table configured to support the target object; a processing gas introduction unit configured to introduce a processing gas into the processing chamber; a microwave introduction unit configured to introduce the microwave into the processing chamber; a gas cooling unit configured to cool the target object by a cooling gas; a radiation thermometer configured to measure a temperature of the target object; and a temperature control unit configured to adjust the temperature of the target object by controlling the gas cooling unit based on the temperature measured by the radiation thermometer.

With this configuration, while the microwave is irradiated to the target object, the temperature of the target object is measured by the radiation thermometer. Based on the measured temperature, the gas cooling unit can be controlled so that the temperature of the target object can be controlled.

In accordance with still another aspect of an illustrative embodiment, there is provided a microwave irradiation apparatus that processes a target object by irradiating microwave. The microwave irradiation apparatus includes a processing chamber configured to be vacuum-evacuated; a supporting table configured to support the target object; a processing gas introduction unit configured to introduce a processing gas into the processing chamber; a microwave introduction unit configured to introduce the microwave into the processing chamber; a heating unit configured to heat the target object; a radiation thermometer configured to measure a temperature of the target object; and a temperature control unit configured to adjust the temperature of the target object by controlling the heating unit based on the temperature measured by the radiation thermometer.

With this configuration, while the microwave is irradiated to the target object, the temperature of the target object is measured by the radiation thermometer. Based on the measured temperature, the heating unit can be controlled so that the temperature of the target object can be controlled accordingly.

In accordance with still another aspect of an illustrative embodiment, there is provided a microwave irradiation apparatus that processes a target object by irradiating microwave. The microwave irradiation apparatus includes a processing chamber configured to accommodate therein the target object; a vacuum evacuation system configured to evacuate an atmosphere within the processing chamber; a microwave introduction unit configured to introduce the microwave into the processing chamber; a gas cooling unit configured to cool the target object by discharging a cooling gas to a rear surface of the target object; a lifter unit that includes a lift pin for supporting the target object and is configured to move the target object up and down; and a vacuum chuck device including a suction hole formed in the lift pin. Here, the suction hole may be connected to the vacuum evacuation system through a suction passage.

With this configuration, while the microwave is effectively irradiated to the target object, the target object can be effectively cooled.

A microwave irradiation apparatus in accordance with illustrative embodiments has remarkable effects as described above.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
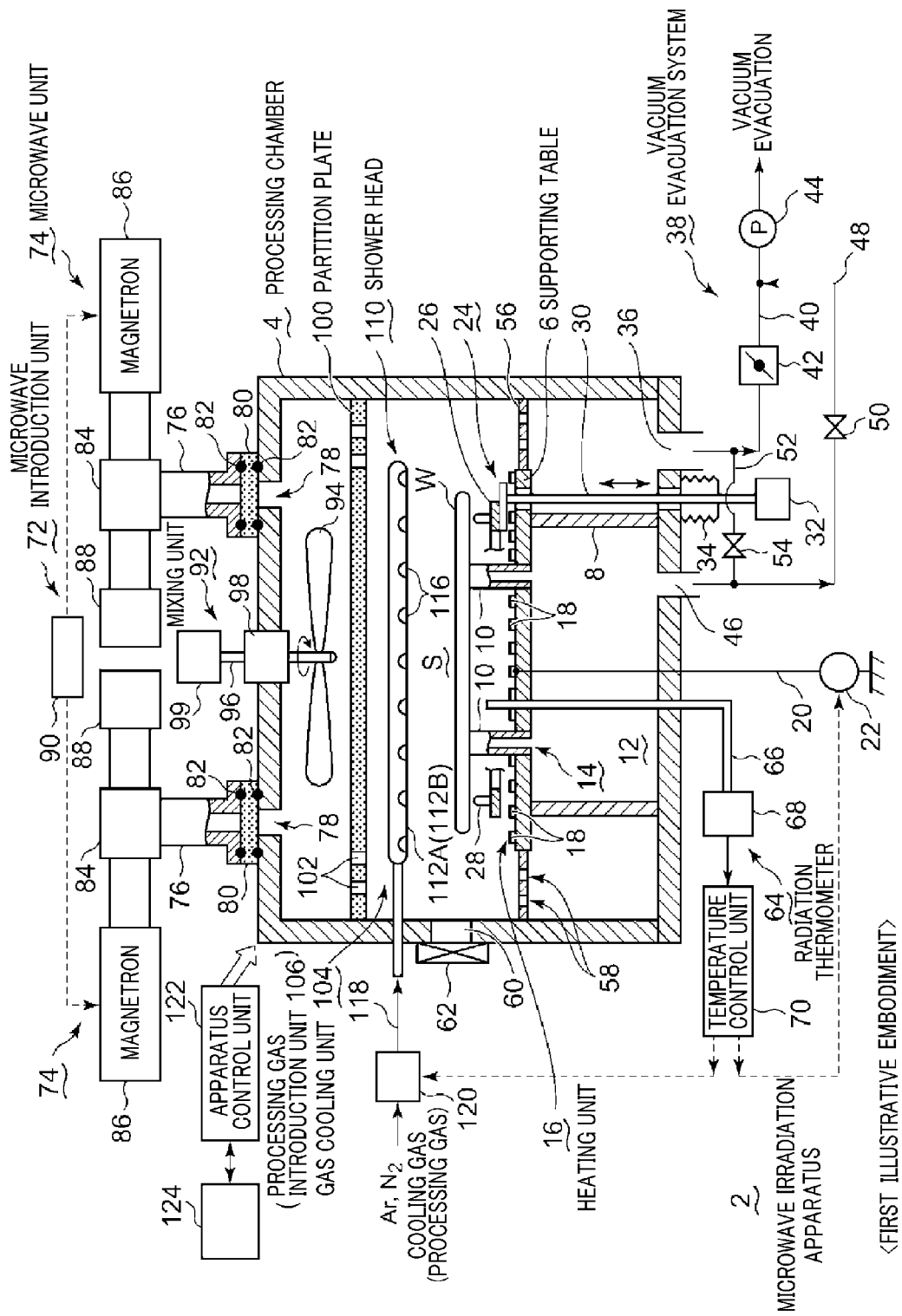
FIG. 1 is a configuration view showing a microwave irradiation apparatus in accordance with a first illustrative embodiment.
Figure 2:
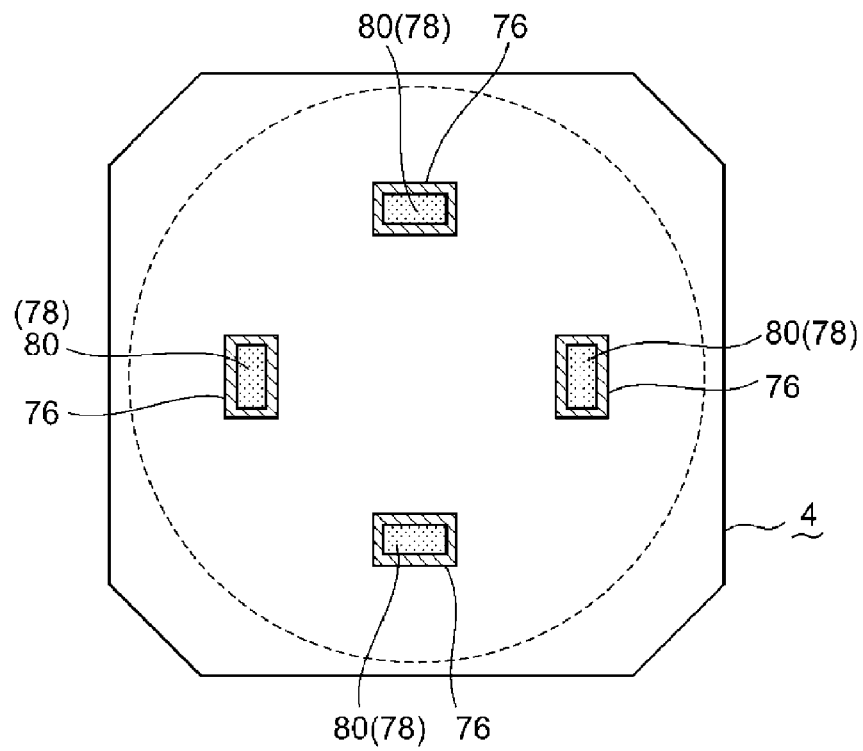
FIG. 2 shows waveguides of a microwave introduction unit positioned at a ceiling of a processing chamber.
Figure 3:
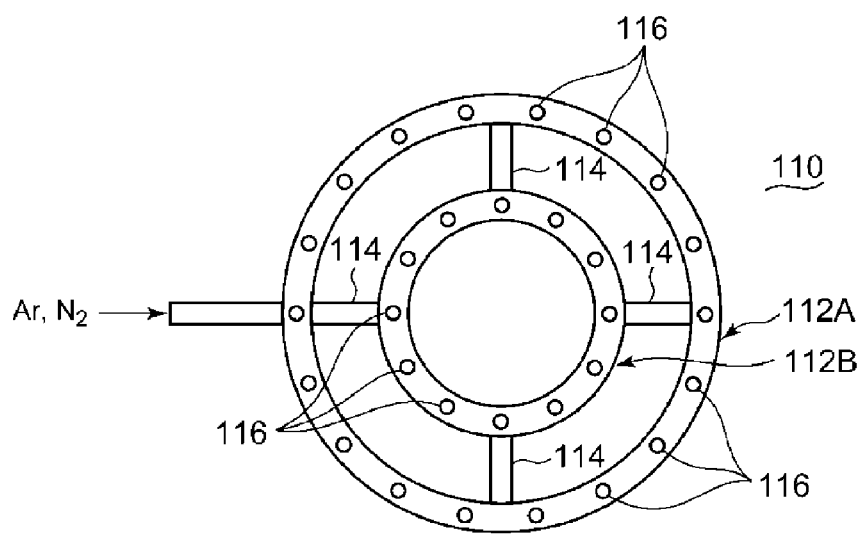
FIG. 3 shows a bottom surface of a shower head of a gas cooling unit (a processing gas introduction unit)

Hereinafter, a microwave irradiation apparatus in accordance with an illustrative embodiment will be described with reference to the accompanying drawings. FIG. 1 is a configuration view showing a microwave irradiation apparatus in accordance with a first illustrative embodiment. FIG. 2 shows waveguides of a microwave introduction unit positioned at a ceiling of a processing chamber. FIG. 3 shows a bottom surface of a shower head of a gas cooling unit (a processing gas introduction unit).

First Illustrative Embodiment

As depicted in the drawings, a microwave irradiation apparatus 2 includes a cylindrical processing chamber 4 made of aluminum, an aluminum alloy or stainless steel, and the inside of processing chamber 4 has a circular cross section shape. Within the processing chamber 4, a supporting table having a circular plate shape is supported by a cylindrical supporting column 8 standing uprightly from a bottom portion of the processing chamber 4. The supporting table 6 and the supporting column 8 are made of metal such as aluminum, an aluminum alloy, and stainless steel.

The supporting table 6 includes a multiple number of, e.g. three, supporting pins 10 (only two illustrated in FIG. 1) extended upwards. Upper ends of these supporting pins 10 are in contact with a rear surface of a semiconductor wafer W as a target object having a diameter of, for example, about 300 mm, and supports the wafer W. The supporting pins are provided along a periphery of the wafer W at a regular interval. The supporting pins 10 are made of a low-k material, i.e., dielectric material having a low dielectric loss, such as quartz or a ceramic material. Further, each of the supporting pins 10 has a hollow portion, i.e. is formed in a tube shape. The hollow supporting pin 10 has an inner diameter of, for example, about 2 mm.

The inside of the cylindrical supporting column 8 is sealed and serves as a chuck airtight space 12. This chuck airtight space 12 communicates with the tube-shaped supporting pins 10 so as to function as a vacuum chuck device 14. Therefore, as described below, by vacuum-evacuating the chuck airtight space 12, the rear surface of the wafer W is vacuum-attracted to the upper ends of the supporting pins 10.

In order to heat the wafer W supported on the supporting table 6, a heating unit 16 is provided. To be specific, the heating unit 16 includes a multiple number of light emitting units 18 provided on a top surface of the supporting table 6. The light emitting units 18 are provided so as to correspond to a substantially entire rear surface of the wafer W. Each light emitting unit 18 includes a multiple number of light emitting elements such as LED elements or laser elements, and the wafer W is heated by light radiated from these light emitting units 18. Here, by arranging the light emitting units 18 in a multiple number of concentric zones, the wafer W may be heated in each zone independently. The light emitting units 18 are connected to a power supply line 20, and a power is supplied from a heating power supply 22 provided at the power supply line 20.

Between the supporting table 6 and the wafer W, there is provided a lifter unit 24 configured to move the wafer W up and down when the wafer W is loaded or unloaded. To be specific, the lifter unit 24 includes a lift plate 26 having a circular arc shape and a multiple number of, for example, three (only two illustrated in FIG. 1), lift pins 28 provided on a top surface of the lift plate 26. The lift pins 28 are provided along a periphery of the rear surface of the wafer W at a substantially regular interval. By moving the lift pins 28 up and down, the wafer W can be moved in a vertical direction.

Further, the lift plate 26 is connected with an upper end of an elevation rod 30. The elevation rod 30 passes through the supporting table 6 and the bottom portion of the processing chamber 4 to be extended downwards. A lower portion of the elevation rod 30 is connected to an actuator 32 that moves the elevation rod 30 up and down. At an area where the elevation rod 30 passes through the bottom portion of the processing chamber 4, there is provided a metallic bellows 34 that allows the elevation rod 30 to move up and down while maintaining airtightness within the processing chamber 4. The lift pin 28 or the lift plate 26 is made of a dielectric material such as quartz or a ceramic material.

In the bottom portion of the processing chamber 4, there is formed an evacuation port 36 for evacuating an atmosphere within the processing chamber 4. The evacuation port 36 is connected to a vacuum evacuation system 38. The vacuum evacuation system 38 includes an evacuation passage 40 connected to the evacuation port 36. A pressure control valve 42 and a vacuum pump 44 are provided at the evacuation passage 40 in sequence from an upstream side toward a downstream side. As described above, the atmosphere within the processing chamber 4 is vacuum-evacuated while an internal pressure thereof is controlled.

A chuck evacuation port 46 is formed in the bottom portion of the processing chamber 4 for forming the chuck airtight space 12. The evacuation passage 40 between the pressure control valve 42 and the vacuum pump 44 is connected to the chuck evacuation port 46 through a chuck evacuation passage 48. A first opening/closing valve 50 is provided at the chuck evacuation passage 48. By opening the first opening/closing valve 50, an atmosphere within the chuck airtight space 12 is vacuum-evacuated, so that the chuck airtight space 12 serves as the vacuum chuck device. As a result, the wafer W can be vacuum-attracted.

The chuck evacuation passage 48 at an upstream side of the first opening/closing valve 50 is connected to the evacuation passage 40 at an upstream side of the pressure control valve 42 through a release passage 52. Further, a second opening/closing valve 54 is provided at the release passage 52. By opening the second opening/closing valve 54 (the first opening/closing valve 50 is closed), a processing space where the wafer W is placed has the same pressure as the inside of the chuck airtight space 12, so that the wafer W can be released from the vacuum-attraction.

Between a periphery of the supporting table 6 and a sidewall within the processing chamber 4, a ring-shaped rectifying plate 56 is provided. The rectifying plate 56 includes a multiple number of rectifying holes 58. Thus, an atmosphere of the processing space S where the wafer W is placed flows downwards while being rectified and is discharged through the evacuation port 36.

At the sidewall of the processing chamber 4, a loading/unloading port 60 for loading and unloading the wafer W is provided. Further, a gate valve 62 is provided at the loading/unloading port 60. The processing chamber 4 includes a radiation thermometer 64 for measuring a temperature of the wafer W. To be specific, the radiation thermometer 64 includes a probe line 66, such as an optical fiber. The probe line 66 passes through the bottom portion of the processing chamber 4 and the supporting table 6 to be extended downward. A leading end of the probe line 66 is positioned right below the rear surface of the wafer W. Based on light introduced into the probe line 66, the temperature of the wafer W is measured by a temperature measurement unit 68.

A temperature measured by the temperature measurement unit 68 is sent to a temperature control unit 70 such as a computer. In the first illustrative embodiment, based on the measured temperature, the temperature control unit 70 controls the heating power supply 22 and a gas cooling unit so as to adjust the temperature of the wafer W.

At the ceiling of the processing chamber 4, a microwave introduction unit 72 for introducing microwave into the processing chamber 4 is provided. Herein, the microwave may be an electromagnetic wave having a frequency ranging from, for example, about 300 MHz to about 30 GHz. To be specific, the microwave introduction unit 72 includes a multiple number of, for example, four, microwave units 74 (only two illustrated in FIG. 1). The number of the microwave units 74 is not limited to four. Further, each of the microwave units 74 includes a waveguide 76 connected to the ceiling of the processing chamber 4. As depicted in FIG. 2, the waveguides 76 have a rectangular cross section and are arranged at the ceiling of the processing chamber 4 along a periphery thereof so as to be equally spaced from each other.

Further, at the ceiling of the processing chamber 4, microwave introduction ports 78 are provided. Transmission windows 80 each made of a dielectric material such as quartz are provided on the microwave introduction ports 78 via sealing members 82 such as O-rings. A lower end of each waveguide 76 is connected to the transmission window 80. The microwaves are introduced into the processing chamber 4 through the transmission windows 80.

A circulator 84 is provided on the way of each waveguide 76. The waveguide 76 is bent by 90 degrees at the circulator 84, and a microwave generator 86 is provided at a base end (upper end) of the waveguide 76. Herein, the microwave has a frequency of about 2.456 GHz, about 5.8 GHz or about 28 GHz. Thus, the microwave generated by the microwave generator 86 is propagated into the waveguide 76 and introduced into the processing chamber 4 through the microwave introduction port 78. The circulator 84 is connected to a dummy load 88, and the dummy load 88 serves as an insulator. Each dummy load 88 may be provided in each of the microwave units 74 or the dummy load 88 may be shared by the microwave units 74.

An operation of the microwave generator 86 is controlled by a microwave control unit 90, and, for example, the microwaves generated by the respective microwave generators 86 are not overlapped with each other. Here, the microwave generated by the microwave generator (magnetron) may have a half-wave sine waveform, a trapezoidal waveform, a rectangular waveform, or the like.

Furthermore, at the ceiling of the processing chamber 4, there is provided a mixing unit 92 configured to mix the microwaves introduced by the microwave introduction unit 72. To be specific, the mixing unit 92 includes a mixing propeller 94 provided right below the ceiling of the processing chamber 4. A rotation shaft 96 of the mixing propeller 94 airtightly passes through the ceiling via a ferrofluid seal 98. The rotation shaft 96 is rotated by a rotation motor 99. The mixing propeller 94 is made of a high-k dielectric material having a low dielectric loss, such as metal, complex ceramic such as PZT, or quartz sapphire. By rotating the mixing propeller 94, the microwaves are mixed, so that a standing wave of the microwaves can be prevented from being generated within the processing chamber 4.

Between the mixing propeller 94 and the supporting table 6, there is provided a partition plate 100 that divides the inside of the processing chamber 4 into an upper space and a lower space. Accordingly, particles falling down from the mixing propeller 94 can be prevented from adhering to a top surface of the wafer W. The partition plate 100 is made of a low-k material, such as quartz, a ceramic material or Teflon (registered trademark). Accordingly, the partition plate 100 hardly absorbs the microwave, so that the microwave can be efficiently transmitted through the partition plate 100. By way of example, desirably, the partition plate 100 may be made of a dielectric material having a permittivity of about 4.0 or less, and tan-delta (dielectric dissipation factor) of about 0.0001 or less. A multiple number of communication holes 102 are formed in a peripheral portion of the partition plate 100, and the upper and lower spaces divided by the partition plate 100 can communicate with each other through the communication holes 102.

Accordingly, since a pressure difference between the upper and lower spaces divided by the partition plate 100 is reduced, the partition plate 100 can have a thickness as small as possible. Desirably, the communication holes 102 may be formed at same horizontal positions as the rectifying holes 58 formed in the rectifying plate 56 positioned below the communication holes 102, when viewed from the bottom of the rectifying plate 56. As a result, when an atmosphere in a space where the mixing propeller 94 is placed is discharged through the communication holes 102, the atmosphere can directly flow down toward the rectifying holes 58 right below the communication holes 102 without being diffused toward the wafer W.

The processing chamber 4 further includes a gas cooling unit 104 for cooling the semiconductor wafer W with a cooling gas. Herein, the gas cooling unit 104 also serves as a processing gas introduction unit 106 that introduces a processing gas into the processing chamber 4. To be specific, the gas cooling unit 104 includes a shower head 110 positioned above the wafer W and below the partition plate 100. The shower head 110, as depicted in FIG. 3, includes a multiple number of, for example, two ring-shaped dispersion pipes 112A and 112B each having a different diameter, and the dispersion pipes 112A and 112B are provided concentrically. The dispersion pipes 112A and 112B are connected to communication pipes 114 so as to communicate with each other.

At bottom surfaces of the dispersion pipes 112A and 112B, a multiple number of gas discharge holes 116 are arranged along peripheries thereof at a regular interval. The cooling gas (the processing gas) can be discharged toward the surface of the wafer W through the gas discharge holes 116. The shower head 110 is made of a low-k material, such as quartz or a ceramic material, and thus the shower head 110 hardly absorbs the microwave.

The shower head 110 is supported by the sidewall of the processing chamber 4, and the shower head 110 is connected to a gas passage 118. A flow rate controller 120 such as a mass flow controller is provided at the gas passage 118, and the cooling gas (the processing gas) is supplied while a flow rate of the cooling gas is controlled. In this case, in order to increase cooling efficiency of the wafer W, the shower head 110 needs to be provided close to the wafer W. By way of example, a distance between the wafer W and the shower head 110 is in a range of from about 10 mm to about 300 mm. Further, an Ar gas, a $N_2$ gas, or a mixed gas of both gases is supplied as the cooling gas and the processing gas. Instead of these gases, other rare gases such as a He gas and a Ne gas may be used as the cooling gas and the processing gas. In some processes, a hydrogen gas or an oxygen gas may be used as the cooling gas and the processing gas.

As described above, based on the measured temperature by the temperature measurement unit 68, the temperature control unit 70 controls the flow rate controller 120 of the processing gas introduction unit 106 and the heating power supply 22 so as to adjust the temperature of the wafer W.

An overall operation of the microwave irradiation apparatus 2 is controlled by an apparatus control unit 122 such as a micro computer. A computer program for executing the operation is stored in a storage medium 124 such as a flexible disc, a CD (Compact Disc), a flash memory, or a hard disc. To be specific, in response to an instruction of the apparatus control unit 122, a gas supply or a gas flow rate, a microwave supply or a microwave power, a wafer temperature or a process pressure may be controlled directly or indirectly.

Hereinafter, a process (an annealing process or a quality modification (reforming) process) performed by the microwave irradiation apparatus 2 will be explained. The gate valve 62 is opened, and the semiconductor wafer W is loaded into the processing chamber 4 by a transfer arm (not shown) through the opened gate valve 62. By moving the lift pins 28 of the lifter unit 24 up and down, the wafer W is mounted on the supporting pins 10 of the supporting table 6. By closing the gate valve 62, the processing chamber 4 is sealed. Here, a semiconductor substrate of a simple substance, for example, a silicon substrate, may be used as the semiconductor wafer W.

At this time, the vacuum pump 44 of the vacuum evacuation system 38 is continuously operated. By opening the first opening/closing valve 50 provided at the chuck evacuation passage 48 (the second opening/closing valve 54 is closed), the chuck airtight space 12 below the supporting table 6 is vacuum-evacuated to be depressurized, so that the chuck airtight space 12 serves as the vacuum chuck device. As a result, the rear surface of the wafer W mounted on the supporting pins 10 is vacuum-attracted. By closing the first opening/closing valve 50 and opening the second opening/closing valve 54 provided at the release passage 52, the chuck airtight space 12 has the same pressure as the processing space S, so that the wafer W can be released from the vacuum-attraction.

Then, when the wafer W is attracted as described above, the Ar gas or the $N_2$ gas as the processing gas is supplied from the shower head 110 of the processing gas introduction unit 106 serving as the gas cooling unit 104 within the processing chamber 4 while a flow rate of the processing gas is controlled. In this case, a process pressure in the processing space S may vary depending on kinds of processes. For example, the process pressure is about several hundred Torr, and a pressure in the chuck airtight space 12 is set to be about several ten mmTorr lower than that of the process pressure in order to serve as a chuck.

A power is supplied from the heating power supply 22 of the heating unit 16 to each of the light emitting units 18. The light radiated from the LED elements or the laser elements of each light emitting unit 18 heat the rear surface of the wafer W to increase the temperature of the wafer W up to a certain level. At the same time, the microwave generator 86 of each microwave unit 74 of the microwave introduction unit 72 is operated to generate microwave. This microwave is propagated into the waveguide 76 and introduced into the processing chamber 4 through each microwave introduction port 78 provided at the ceiling of the processing chamber 4. Further, this microwave passes through the partition plate 100 to be irradiated to the surface of the wafer W. In this way, if the microwave is irradiated to the wafer W, the wafer W can be heated more quickly by electromagnetic wave heating such as Joule heating, magnetic heating, and dielectric heating. As a result, the annealing process or the quality modification (reforming) process is performed.

When a process temperature of the wafer W is relatively high, if the wafer W is heated to a high temperature by only the microwaves, an electrical discharge may occur on the surface of the wafer W. Therefore, as described above, the heating unit 16 is additionally provided to heat the wafer W, so that the wafer W can be heated to a high temperature without causing an electrical discharge on the surface of the wafer W. In this case, the temperature of the wafer W may be in a range of, for example, from about 100° C. to about 400°

C. While a process is performed by the microwaves, the mixing propeller 94 of the mixing unit 92 provided at the ceiling of the processing chamber 4 is rotated. In this way, the microwaves introduced into the processing chamber 4 are mixed by the mixing propeller 94, so that it is possible to prevent a standing wave within the processing chamber 4 from be generated. As a result, it is possible to improve uniformity in the surface of the wafer during the process.

During the process, light from the wafer W is introduced into the probe line 66 of the radiation thermometer 64 provided near the rear surface of the wafer W, and the temperature of the wafer W is continuously measured by the temperature unit 68. The measured temperature is sent to the temperature control unit 70. Based on the measured temperature, the temperature control unit 70 controls the heating power supply 22 to increase or decrease a supply power into the light emitting units 18 and controls the flow rate controller 120 of the gas cooling unit (the processing gas introduction unit) 104 to increase or decrease a flow rate of the cooling gas (the processing gas). In this way, the temperature of the wafer W can be adjusted (controlled).

The microwave absorptance may be changed depending on the temperature of the wafer W. Accordingly, in the present embodiment, by way of example, while a supply power of the microwaves is controlled to be uniform, a supply power supplied into the light emitting units 18 is controlled or a flow rate of the cooling gas discharged toward the surface of the wafer W is controlled in order to maintain the temperature of the wafer W at a certain level. Therefore, the temperature of the wafer W can be controlled independently from the supply power of the microwaves.

Further, the rotation of the mixing propeller 94 may generate particles. However, the generated particles are received by the partition plate 100 disposed below the mixing propeller 94, and, thus, the particles do not fall toward the surface of the wafer W. Even if the generated particles are introduced into the processing space S together with an atmosphere through the communication holes 102, this atmosphere flows directly toward the rectifying holes 58 of the rectifying plate 56 disposed right below the communication holes 102. Thus, it is possible to prevent the particles from adhering to the surface of the wafer W.

As described above, while the microwaves are irradiated to the semiconductor wafer W as the target object, the temperature of the target object is measured by the radiation thermometer 64, and the heating unit 16 and the gas cooling unit 104 are controlled based on the measured temperature. As a result, the temperature of the target object can be controlled independently from an irradiation amount of the microwaves.

Second Illustrative Embodiment

Figure 4:
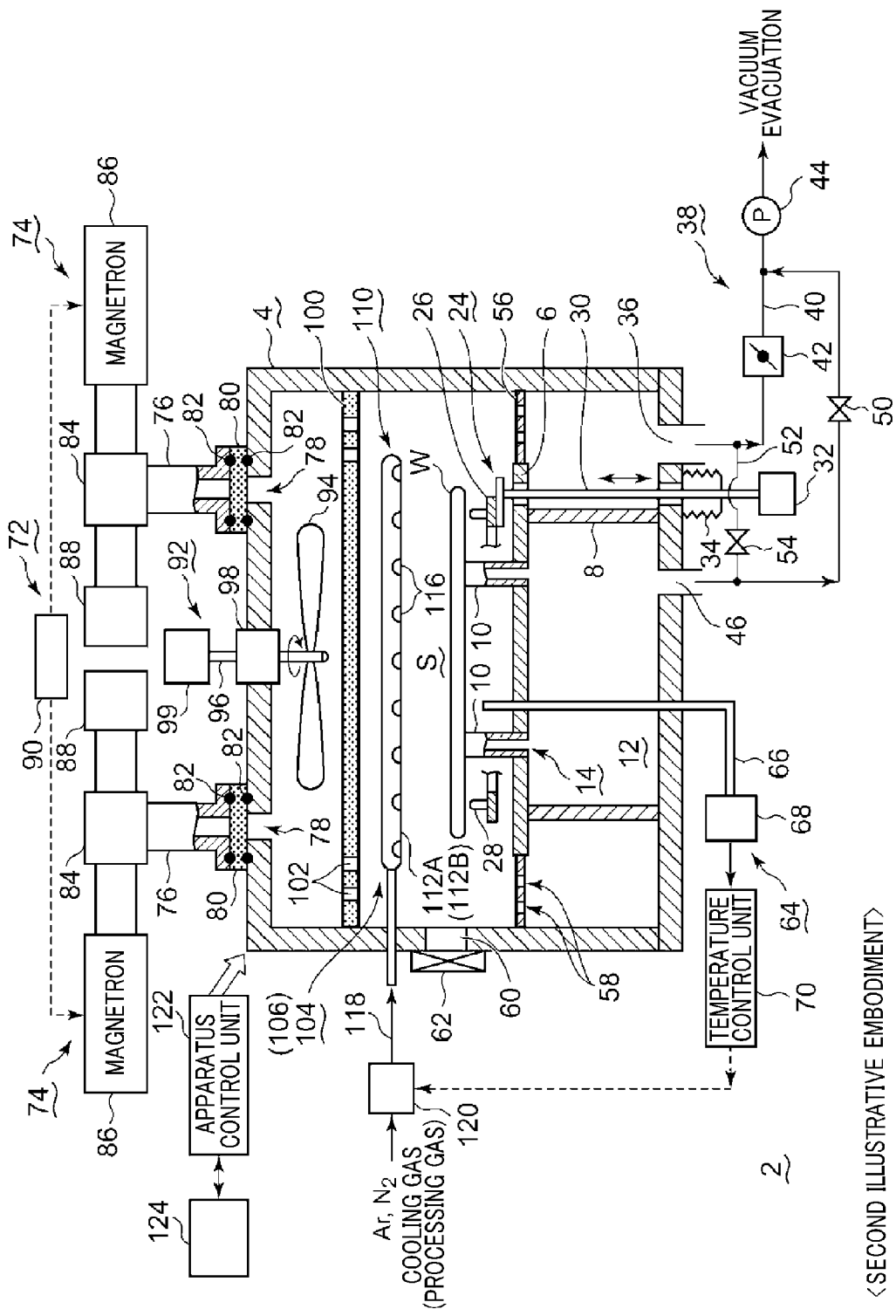
FIG. 4 is a configuration view showing a microwave irradiation apparatus in accordance with a second illustrative embodiment.

Hereinafter, a microwave irradiation apparatus in accordance with a second illustrative embodiment will be explained. In some process for the semiconductor wafer W, the temperature of the wafer W does not need to be increased so high. That is, the wafer W may be sufficiently heated by irradiation of microwaves, so that the temperature of the wafer W can be increased to a target temperature range. In this case, the heating unit 16 used in the first illustrative embodiment may not be needed. FIG. 4 is a configuration view showing a microwave irradiation apparatus in accordance with a second illustrative embodiment. In FIG. 4, same components as illustrated in FIGS. 1 to 3 will be assigned same reference numerals and explanations thereof will be omitted.

As depicted in FIG. 4, the light emitting units 18 and the heating power supply 22 as components of the heating unit 16 (see FIG. 1) are omitted from the microwave irradiation apparatus depicted in FIG. 1. The other components are the same as depicted in FIG. 1. Further, since the heating unit 16 is omitted, the temperature control unit 70 controls the gas cooling unit 104 (the processing gas introduction unit 106) to adjust the flow rate of the cooling gas. As a result, the temperature of the wafer W can be adjusted.

In this case, the same effect as shown in the first illustrative embodiment can be obtained. That is, while the microwave is irradiated to the semiconductor wafer W as a target object, the temperature of the target object is measured by the radiation thermometer 64, and the gas cooling unit 104 is controlled based on the measured temperature. As a result, the temperature of the target object can be adjusted.

Third Illustrative Embodiment

Figure 5:
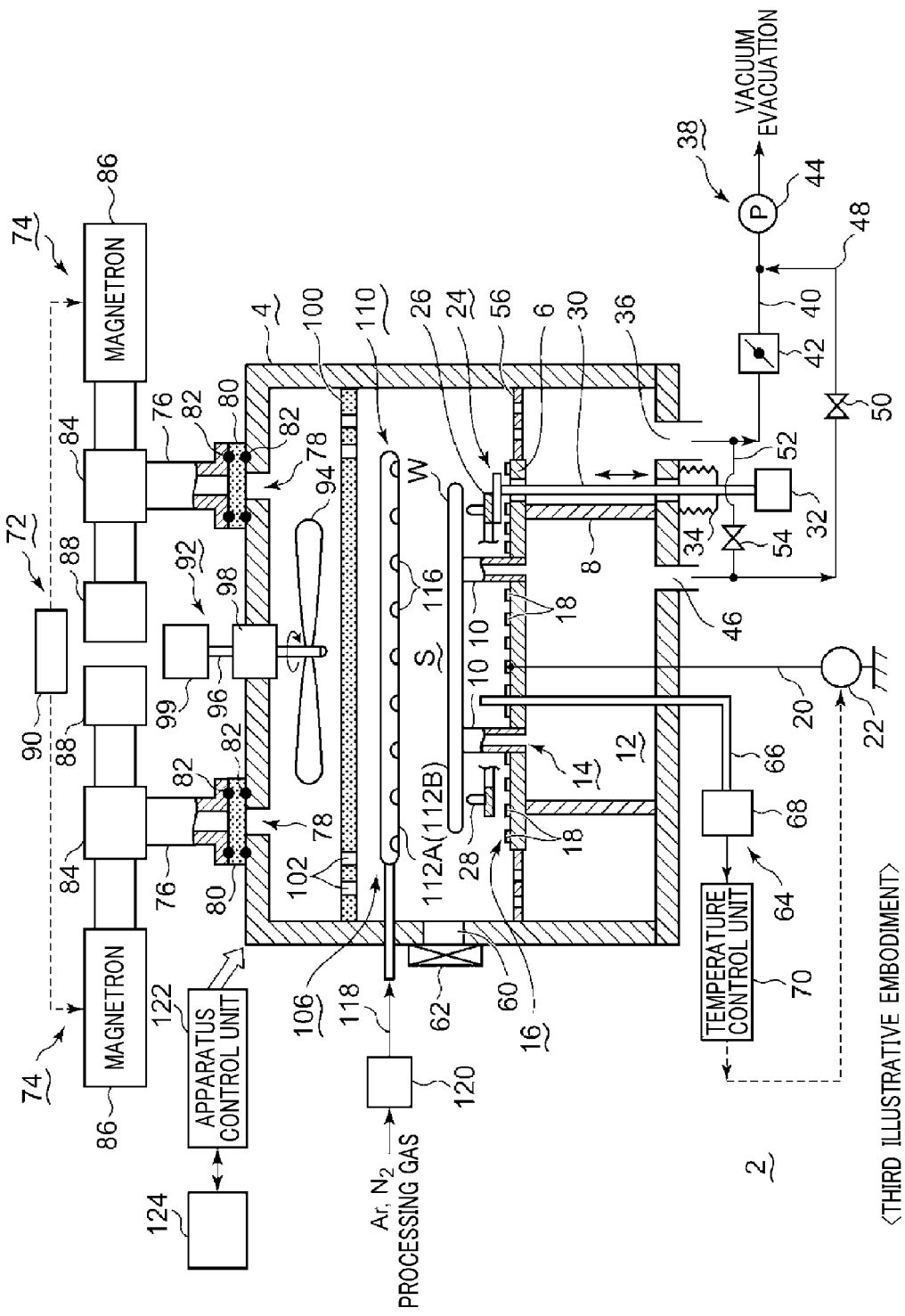
FIG. 5 is a configuration view showing a microwave irradiation apparatus in accordance with a third illustrative embodiment.

Hereinafter, a microwave irradiation apparatus in accordance with a third illustrative embodiment will be explained. In some processes for the semiconductor wafer W, since a process temperature is relatively high, the wafer W does not need to be cooled by the gas cooling unit. The temperature of the wafer W can be sufficiently controlled to a target temperature by controlling the heating unit. In this case, the gas cooling unit 104 used in the first illustrative embodiment may not be needed. FIG. 5 is a configuration view showing a microwave irradiation apparatus in accordance with a third illustrative embodiment. In FIG. 5, same components as illustrated in FIGS. 1 to 3 will be assigned same reference numerals and explanations thereof will be omitted.

As depicted in FIG. 5, the gas cooling unit 104 is omitted from the microwave irradiation apparatus depicted in FIG. 1. The other components are the same as depicted in FIG. 1. That is, the gas cooling unit 104 depicted in FIG. 1 also serves as the processing gas introduction unit 106, but in this present embodiment, the shower head 110 and the flow rate controller 120 serves as only the processing gas introduction unit 106. Further, since the gas cooling unit 104 is not provided, the temperature control unit 70 controls the heating power supply 22 of the heating unit 16. As a result, the temperature of the wafer W can be adjusted.

In this case, the same effect as shown in the first illustrative embodiment can be obtained. That is, while the microwave is irradiated to the semiconductor wafer W as a target object, the temperature of the target object is measured by the radiation thermometer 64, and the heating unit 16 is controlled based on the measured temperature. As a result, the temperature of the target object can be adjusted.

<Modification Example of Gas Cooling Unit (Processing Gas Introduction Unit)>

Figure 6:
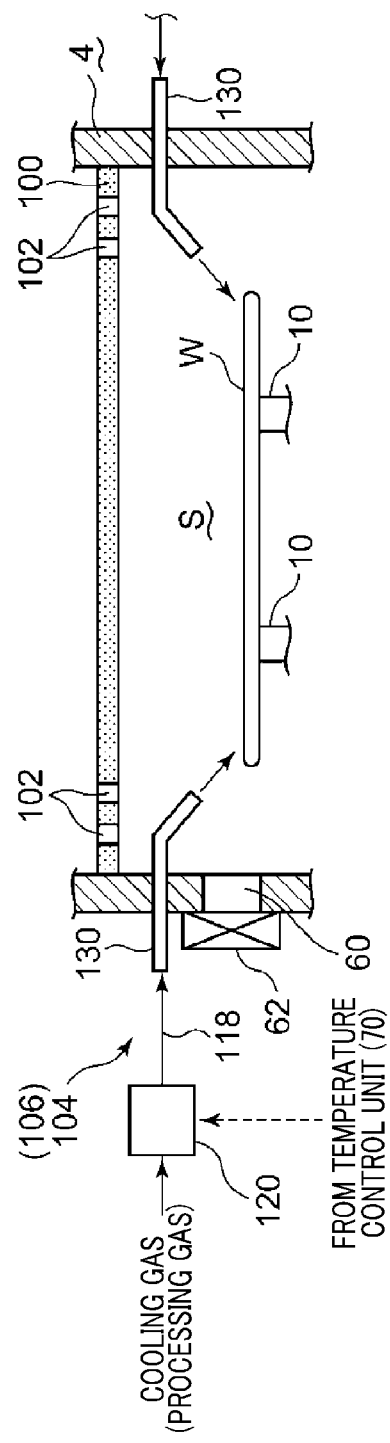
FIG. 6 shows a modification example of the gas cooling unit.

Hereinafter, a modification example of a gas cooling unit (a processing gas introduction unit) will be explained. In the above-described first to third illustrative embodiments, the gas cooling unit 104 or the processing gas introduction unit 106 includes two dispersion pipes 112A and 112B provided concentrically (see FIG. 3). However, there is no limitation thereto, and nozzles may be used. FIG. 6 shows a modification example of a gas cooling unit (a processing gas introduction unit). In FIG. 6, same components as illustrated in FIGS. 1 to 5 will be assigned same reference numerals and explanations thereof will be omitted.

As depicted in FIG. 6, instead of the shower head 110 (see FIG. 1), a multiple number of gas nozzles 130 passing through the sidewall of the processing chamber 4 are provided. Front ends of the gas nozzles 130 face a surface of the wafer W with an inclination from an upper side of the wafer W. Thus, since the cooling gas (the processing gas) is directly discharged toward the surface of the wafer W, cooling efficiency can be increased. Further, the number of the gas nozzles 130 is not limited.

In the above descriptions of each embodiment (except the third embodiment), although the gas cooling unit 104 also serves as the processing gas introduction unit 106, there is no limitation thereto. These components may be separately provided. By way of example, the gas cooling unit 104 may include the gas nozzles 130 as depicted in FIG. 6, and the processing gas introduction unit 106 may include the shower head 110 as depicted in FIG. 1, or vice versa. Although the light emitting units 18 (see FIG. 1) including the LED elements or the laser elements are used as the heating unit 16, there is no limitation thereto. Heating lamps such as halogen lamps, mercury lamps, and flash lamps may be used instead.

Fourth Illustrative Embodiment

Hereinafter, a microwave irradiation apparatus in accordance with a fourth illustrative embodiment will be explained. In some processes for the semiconductor wafer W, in the same manner as the second illustrative embodiment, by way of example, a process temperature of the wafer W needs to be maintained low in order to protect an underlying film from heat. In this case, the heating unit 16 used in the first illustrative embodiment is not needed. Since a temperature of the wafer W is highly increased by the heating through microwave irradiation, the wafer W needs to be efficiently cooled during the process.

Figure 7:
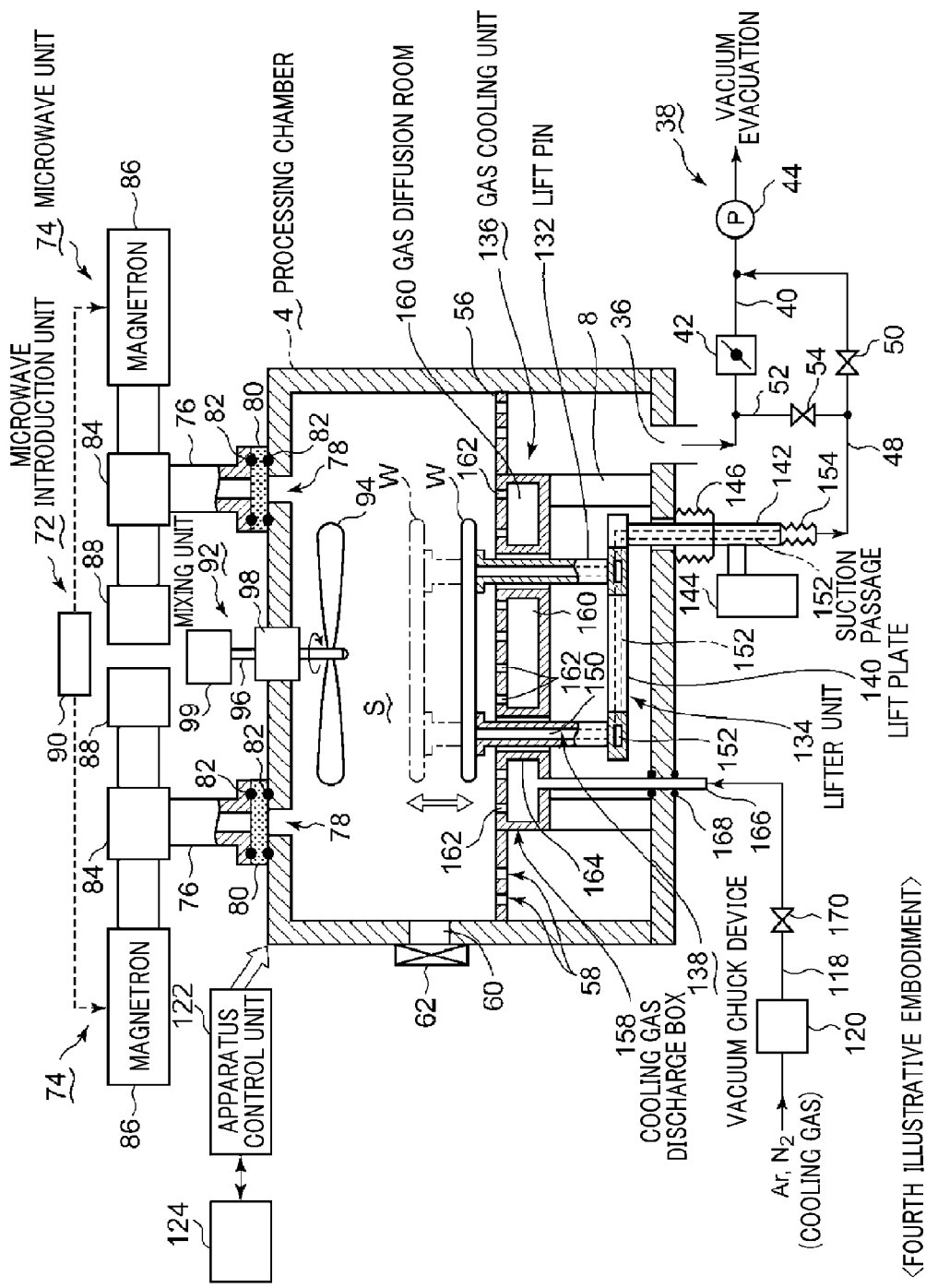
FIG. 7 is a configuration view showing a microwave irradiation apparatus in accordance with a fourth illustrative embodiment.
Figure 8:
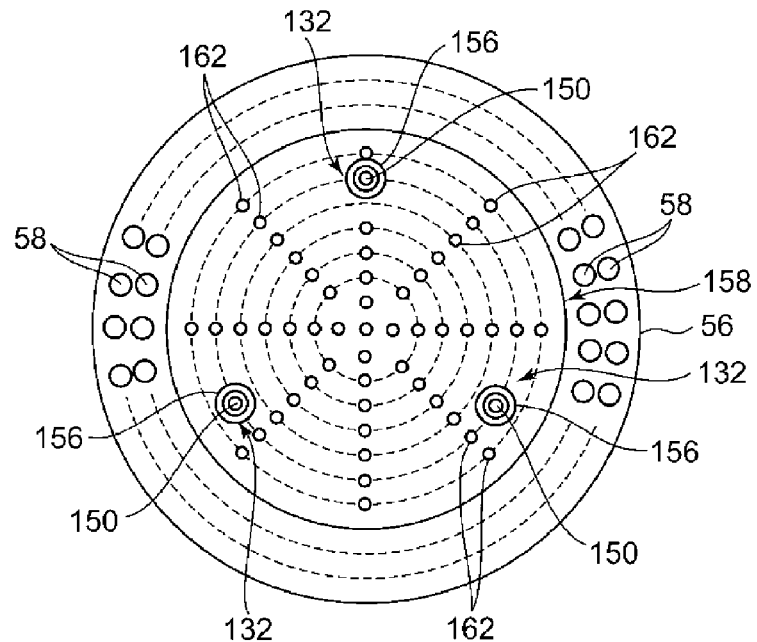
FIG. 8 is a plane view showing a vicinity of a cooling gas discharge box of the gas cooling unit.
Figure 9:
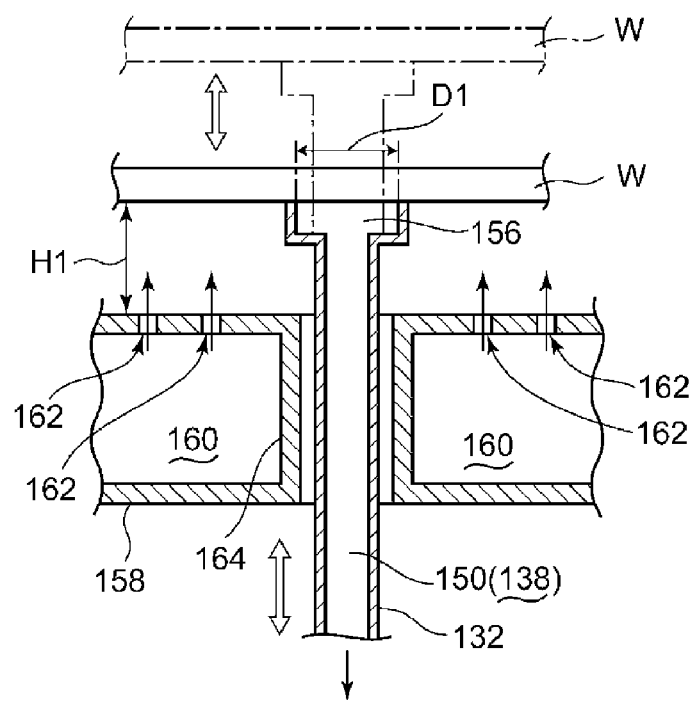
FIG. 9 is an enlarged cross sectional view of a part of a lift pin of a lifter unit.

FIG. 7 is a configuration view showing a microwave irradiation apparatus in accordance with a fourth illustrative embodiment. FIG. 8 is a plane view showing a vicinity of a cooling gas discharge box of a gas cooling unit. FIG. 9 is an enlarged cross sectional view of a part of a lift pin of a lifter unit. In FIGS. 7 to 9, same components as illustrated in FIGS. 1 to 6 will be assigned same reference numerals and explanations thereof will be omitted.

As depicted in FIG. 7, in a microwave irradiation apparatus in accordance with the fourth illustrative embodiment, the microwave introduction unit 72 and the mixing unit 92 are provided at the ceiling of the processing chamber 4 in the same manner as the first illustrative embodiment. However, the partition plate 100 and the shower head 110 (see FIG. 1) obstructing microwave irradiation are not provided. As a result, the microwave can be irradiated directly toward the semiconductor wafer W as a target object from the microwave introduction port 78 of the microwave introduction unit 72 provided at the ceiling.

The processing chamber 4 includes lift pins 132 for supporting the semiconductor wafer W; a lifter unit 134 configured to move the wafer W up and down; and a gas cooling unit 136 configured to discharge a cooling gas to a rear surface of the wafer W to cool the wafer W. Further, the processing chamber 4 includes a vacuum chuck device 138 configured to attract the wafer W to the lifter unit 134.

To be specific, the lifter unit 134 includes the lift pins 132; a lift plate 140 connected to lower ends of the lift pins 132 to support the lift pins 132; an elevation rod 142 whose upper end is connected to the lift plate 140; and an actuator 144 configured to move the elevation rod 142 up and down. A multiple number of, for example, three lift pins 132 (only two illustrated in FIG. 7) are arranged along a periphery of the lift plate 140 at a regular interval (see FIG. 8).

The lift plate 140 has, for example, a circular ring shape. A top surface of the lift plate 140 is connected to the lower ends of the lift pins 132. Alternatively, the lift plate 140 may have a circular arc shape or a circular plate shape. Upper ends of the lift pins 132 are in contact with a periphery of the rear surface of the wafer W to support the wafer W.

An end of the lift plate 140 is connected to the upper end of the elevation rod 142. A lower part of the elevation rod 142 passes through a bottom portion of the processing chamber 4 to be extended downwards. A lower end of the elevation rod 142 is connected to the actuator 144 that moves up and down the lift plate 140 and the lift pins 132 as a single unit. At an area where the elevation rod 142 passes through the bottom portion of the processing chamber 4, there is provided a metallic bellows 146 that allows the elevation rod 142 to move up and down while maintaining airtightness within the processing chamber 4.

Herein, the lift pins 132, the lift plate 140, and the elevation rod 142 are made of a dielectric material hardly absorbing the microwave, such as quartz ($SiO_2$) or a ceramic material such as silicon carbide (SiC), aluminum nitride (AlN), or alumina ($Al_2O_3$). In the present embodiment, a suction hole 150 is formed in each of the lift pins 132. The suction hole 150 serves as a part of the vacuum chuck device 138. To be specific, the suction hole 150 is formed in a central area of the lift pin 132 along a longitudinal direction thereof. A suction passage 152 is formed in the lift plate 140 and the elevation rod 142. One end of the suction passage 152 communicates with a lower end of the suction hole 150 within the lift pin 132.

Further, the other end of the suction passage 152 within the elevation rod 142 is connected to one end of the chuck evacuation passage 48 via a metallic bellows 154 that allows the elevation rod 142 to move up and down. The other end of the chuck evacuation passage 48 is connected to the evacuation passage 40 between the pressure control valve 42 and the vacuum pump 44 of the vacuum evacuation system 38.

The first opening/closing valve 50 is provided at the chuck evacuation passage 48. By opening the first opening/closing valve 50, atmospheres within the suction passage 152 and the suction hole 150 are vacuum-evacuated, so that the wafer W can be vacuum-attracted by vacuum chuck function.

The chuck evacuation passage 48 at an upstream side of the first opening/closing valve 50 is connected to the evacuation passage 40 at an upstream side of the pressure control valve 42 through the release passage 52. Further, the second opening/closing valve 54 is provided at the release passage 52. By opening the second opening/closing valve 54 (the first opening/closing valve 50 is closed), a processing space where the wafer W is placed has the same pressure as the inside of the suction hole 152 so that the wafer W can be released from the vacuum-attraction.

Herein, the upper end of the lift pin 132 has an enlarged diameter as depicted in FIG. 9. That is, a diameter of a suction port 156 as an upper end of the suction hole 150 is increased. Thus, a suction area is increased so as to generate a sufficient attractive force for attracting the wafer W. In this case, the diameter of the suction port 156 is set so as not to blow the wafer W over by the cooling gas discharged toward the rear surface of the wafer W and so as not to generate an excessively high attractive force, as described below. A diameter D1 of the suction port 156 varies depending on evacuation/suction capacity of the vacuum evacuation system 38 but may be in a range of, for example, from about 2 mm to about 10 mm. Herein, the diameter D1 is set to be, for example, about 3 mm.

The gas cooling unit 132 configured to discharge the cooling gas toward the rear surface of the wafer W supported by the lift pins 132 includes a cooling gas discharge box 158 provided below the wafer W. The cooling gas discharge box 158 has a round box shape or a container shape having a diameter little larger than a diameter of the wafer W. The cooling gas discharge box 158 is supported by supporting columns 8 standing uprightly from a bottom portion of the processing chamber 4. In this case, the single cylindrical supporting column 8 having a large diameter in the first illustrative embodiment may be used or a multiple number of cylindrical supporting columns 8 each having a small diameter may be used.

In this embodiment, the cooling gas discharge box 158 is supported by the multiple number of cylindrical supporting columns 8 each having a small diameter. The cooling gas discharge box 158 includes a gas diffusion room 160 therein. A multiple number of gas discharge holes 162 are formed uniformly on an entire upper wall of the cooling gas discharge box 158. The cooling gas is discharged from each gas discharge hole 162 toward the rear surface of the wafer W so as to cool the wafer W.

In the cooling gas discharge box 158, pin insertion through pipes 164 are provided at a position corresponding to the lift pins 132 in a vertical direction thereof. The lift pins 132 are inserted into the pin insertion through pipes 164 to pass therethrough. An inside of the pin insertion through pipe 164 is airtightly partitioned from the gas diffusion room 160. The cooling gas discharge box 158 may be made of metal, hardly causing metal contamination, such as aluminum or an aluminum alloy, quartz or a ceramic material.

Further, a gas introduction line 166 is extended downwards from the cooling gas discharge box 158. The gas introduction line 166 penetrates the bottom portion of the processing chamber 4 via sealing members 168 such as O-rings. The gas introduction line 166 is connected to a gas passage 118. The flow rate controller 120 such as a mass flow controller or an opening/closing valve 170 are provided at the gas passage 118, and the cooling gas such as an Ar gas or a $N_2$ gas is supplied through the gas passage 118 while being controlled its flow rate. Other rare gases such as a He gas and a Ne gas may be used as the cooling gas.

Between a periphery of the cooling gas discharge box 158 and the sidewall of the processing chamber 4, the ring-shaped rectifying plate 56 is provided. The rectifying plate 56 includes the multiple number of rectifying holes 58. Thus, an atmosphere of the processing space S where the wafer W is placed flows downwards while being rectified, and is discharged through the evacuation port 36.

Hereinafter, a process (an annealing process or a quality modification (reforming) process) performed by the above-described microwave irradiation apparatus will be explained. The gate valve 62 is opened, and the semiconductor wafer W is loaded into the processing chamber by a transfer arm (not shown) through the opened gate valve 62. By moving the lift pins 132 of the lifter unit 134 up and down, the upper ends of the lift pins 132 move up the rear surface of the wafer W, so that the wafer W is received by the lift pins 132. After the transfer arm is retreated, the gate valve 62 is closed, and the inside of the processing chamber 4 is sealed. In this case, for example, a semiconductor substrate of a simple substance, for example, a silicon substrate may be used as the semiconductor wafer W.

At this time, the vacuum pump 44 of the vacuum evacuation system 38 is continuously operated. By opening the first opening/closing valve 50 provided at the chuck evacuation passage 48 of the vacuum chuck device 138 (the second opening/closing valve 54 is closed), atmospheres of the inside of the suction passage 152 within the lift plate 140 and the elevation rod 142 of the lifter unit 134 and the inside of the suction hole 150 within the lift pin 132 are vacuum-evacuated to be depressurized. In this way, the inside of the suction hole 150 within the lift pin 132 and the suction passage 152 within the lift plate 140 serve as the vacuum chuck device. As a result, the rear surface of the wafer W mounted on the lift pins 132 can be vacuum-attracted. By closing the first opening/closing valve 50 and opening the second opening/closing valve 54 provided at the release passage 52, the chuck airtight space 12 has the same pressure as the processing space S, so that the wafer W can be released from the vacuum-attraction.

Then, when the wafer W is attracted as described above, the lift pins 132 are lowered down to a position where a process is performed and stopped at that position. Here, the wafer W is positioned above the cooling gas discharge box 158 not in contact with an upper surface of the cooling gas discharge box 158. In this state, the process is started.

Thereafter, by operating the gas cooling unit 136, an Ar gas or a $N_2$ gas as the cooling gas is supplied into the gas diffusion room 160 while a flow rate thereof is controlled, and then, is diffused therein. By discharging the cooling gas upwardly through each gas discharge hole 162, the cooling gas is discharge throughout an entire rear surface of the wafer W. In this way, the wafer W is cooled. Here, there is a gap having a certain width H1 between the rear surface of the wafer W and the upper surface of the cooling gas discharge box 158. The cooling gas discharged through each gas discharge hole 162 can be dispersed uniformly throughout the entire rear surface of the wafer W. By way of example, the width H1 of the gap may be in a range of from about several mm to about several cm. Here, a process pressure in the processing space S may vary depending on kinds of processes, but the process pressure in the processing space S is about several hundred Torr. Further, a pressure in the suction hole 150 is about several ten mmTorr lower than that in the processing space S in order to serve as a chuck.

At the same time, the microwave generator 86 of each microwave unit 74 of the microwave introduction unit 72 is operated to generate microwave. This microwave is propagated into the waveguide 76 and introduced into the processing chamber 4 through each microwave introduction port 78 provided at the ceiling of the processing chamber 4. Here, this microwave is irradiated directly to the surface of the wafer W. In this way, if the microwave is irradiated to the wafer W, the wafer W can be heated more quickly by electromagnetic wave heating such as Joule heating, magnetic heating, and dielectric heating. As a result, the annealing process or the quality modification (reforming) process is performed.

Since the temperature of the wafer W is increased by absorbing the microwave, as described above, the wafer W is cooled by discharging the cooling gas to the rear surface of the wafer W through each gas discharge hole 162 of the cooling gas discharge box 158. Since the cooling gas is substantially uniformly discharged to the rear surface of the wafer W, temperature uniformity in the surface of the wafer W can be improved. Here, a process temperature of the wafer W may be in a range of, for example, from about 100° C. to about 400° C.

Meanwhile, when the cooling gas is discharged to the rear surface of the wafer W, an upthrust is applied to the wafer W by the cooling gas. However, since the lift pins 132 supporting the wafer W from its rear surface serve as the vacuum chuck device 138, the wafer W can be efficiently cooled while preventing deviation of the wafer W. Further, by appropriately adjusting the diameter of the suction port 156 provided at the upper ends of the lift pins 132, an attractive force generated in suction port 156 is set to be substantially equal to or slightly greater than the upthrust generated by the cooling gas discharged to the rear surface of the wafer W. Accordingly, even if the wafer W is thermally expanded and contracted, such thermal expansion and contraction can be acceptable. Therefore, a great frictional force is not generated between the rear surface of the wafer W and upper end surfaces of the lift pins 132, so that it is possible to suppress generation of particles or damage to the rear surface of the wafer W.

The gap between the rear surface of the wafer W and the upper surface of the cooling gas discharge box 158 has an optimum width H1 for absorbing microwave by the wafer W, but the optimum width H1 may vary depending on a condition of irradiated microwave. However, since the microwave is irradiated while the wafer W is held on the lift pins 132, the wafer W can be processed after setting the appropriate width H1. In the present embodiment, while the microwave is efficiently irradiated to the target object such as the semiconductor wafer W, the target object can be cooled efficiently.

Although the flow rate of the cooling gas is fixed in the present embodiment, it is not limited thereto. By way of example, in the same manner as the first illustrative embodiment, the radiation thermometer for measuring the temperature of the wafer W is provided, and the flow rate of the cooling gas is controlled by a feedback control based on the measured temperature. In this way, the temperature of the wafer W can be adjusted.

Further, although only the cooling gas is introduced into the processing chamber 4, a processing gas, for example, a reduction gas such as a $H_2$ gas or an oxidizing gas such as an $O_2$ gas may be introduced in some processes. In such processes, a processing gas passage may be connected to the gas passage 118 of the gas cooling unit 136, and the processing gas may be introduced into the processing gas passage while controlling a flow rate thereof. As a result, the cooling gas may be supplied with the processing gas together. In this case, the gas cooling unit may also serve as the processing gas introduction unit.

If the processing gas is introduced, in addition to the gas cooling unit 136, the processing gas introduction unit 106 including the shower head 110 may be provided at an upper region within the processing chamber 4, as depicted in FIG. 1.

In the fourth illustrative embodiment, although the cooling gas discharge box 158 is used as the gas cooling unit 136, the gas cooling unit 136 is not limited thereto. By way of example, as depicted in FIGS. 1 and 3, the shower head 110 including the multiple number of dispersion pipes 112A and 112B and the communication pipe 114 may be used. Here, the shower head 110 may be provided below the wafer W, and the cooling gas may be upwardly discharged to the rear surface of the wafer W through the gas discharge holes 116. Further, the width H1 (see FIG. 9) of the gap between the rear surface of the wafer W and the upper surface of the cooling gas discharge box 158 may be changed depending on kinds of processes.

Herein, although the semiconductor wafer is used as the target object, the semiconductor wafer includes, but is not limited to, a silicon substrate or a compound semiconductor substrate made of, such as, GaAs, SiC, or GaN. Further, other types of substrates such as a ceramic substrate and a glass substrate used for a liquid crystal display may be used.

What is claimed is:

1. A microwave irradiation apparatus that processes a target object by irradiating microwave, the apparatus comprising:
    a processing chamber configured to be vacuum-evacuated;
    a supporting table configured to support the target object;
    a processing gas introduction unit configured to introduce a processing gas into the processing chamber;
    a microwave introduction unit configured to directly irradiate the microwave to an upper surface of the target object and heat the target object;
    a gas cooling unit configured to cool the target object by a cooling gas;
    a radiation thermometer configured to measure a temperature of the target object heated by the microwave; and
    a temperature control unit configured to adjust the temperature of the target object by controlling the gas cooling unit based on the temperature measured by the radiation thermometer,
    wherein the gas cooling unit includes a shower head provided above the supporting table, and
    the shower head is configured to discharge the cooling gas toward the upper surface of the target object to cool the target object.

2. The microwave irradiation apparatus of claim 1, wherein the gas cooling unit also serves as the processing gas introduction unit.

3. The microwave irradiation apparatus of claim 1, wherein a mixing unit configured to mix the microwave introduced by the microwave introduction unit is provided at a ceiling of the processing chamber.

4. The microwave irradiation apparatus of claim 3, wherein a partition plate made of a dielectric material is provided between the mixing unit and the supporting table.

5. The microwave irradiation apparatus of claim 4, wherein a communication hole configured to communicate with upper and lower spaces partitioned by the partition plate is formed in a peripheral portion of the partition plate.

6. The microwave irradiation apparatus of claim 1, wherein the target object is supported on the supporting table via a plurality of supporting pins.

7. The microwave irradiation apparatus of claim 6, wherein each of the supporting pins has a hollow portion and serves as a vacuum chuck device for vacuum-attracting a rear surface of the target object.

8. The microwave irradiation apparatus of claim 7,
    wherein a lower space of the supporting table serves as a chuck airtight space that is vacuum-evacuated to serve as a part of the vacuum chuck device, and
    the chuck airtight space communicates with the plurality of supporting pins.

\* \* \* \* \*

UNITED STATES PATENT AND TRADEMARK OFFICE
CERTIFICATE OF CORRECTION

PATENT NO. : 9,224,623 B2  
APPLICATION NO. : 13/399163  
DATED : December 29, 2015  
INVENTOR(S) : Shigeru Kasai et al.

Page 1 of 1

It is certified that error appears in the above-identified patent and that said Letters Patent is hereby corrected as shown below:

In the Specification,

Column 4, line 13, please insert -- 6 -- between "table" and "having".

Column 4, line 24, please insert --10 -- between "pins" and "are".

Column 6, line 40, please insert -- 86 -- between "(magnetron)" and "may".

Signed and Sealed this
Twenty-third Day of August, 2016

Michelle K. Lee
*Director of the United States Patent and Trademark Office*